United States Patent [19]

Sugiura et al.

[11] Patent Number: 6,031,277
[45] Date of Patent: Feb. 29, 2000

[54] MULTI-LAYERED CONDUCTING DEVICES AND METHODS FOR MANUFACTURING THE SAME

[75] Inventors: Katsura Sugiura; Sei Utsunomiya, both of Obu, Japan

[73] Assignee: Tokai Kogyo Kabushiki Kaisha, Aichi-Ken, Japan

[21] Appl. No.: 09/015,933

[22] Filed: Jan. 30, 1998

[30] Foreign Application Priority Data

Jan. 31, 1997 [JP] Japan .................................. 9-018559

[51] Int. Cl.⁷ .................................................. H01L 23/498
[52] U.S. Cl. ......................... 257/672; 257/666; 257/671
[58] Field of Search ..................... 257/672, 669, 257/666, 750, 758, 723, 671, 674; 438/111, 123; 361/813

[56] References Cited

U.S. PATENT DOCUMENTS 5,099,306   3/1992   Dunaway et al. .................. 257/666
5,681,777  10/1997   Lynch et al. ....................... 438/111

*Primary Examiner*—Mahshid Saadat
*Assistant Examiner*—Jhihan B Clark
*Attorney, Agent, or Firm*—Dennison, Scehiner, Schultz & Wakeman

[57] ABSTRACT

A multi-layered conductive device is constituted of a plurality of conductive elements disposed in at least two layers, and an insulating film disposed between the respective conductive elements. The multi-layered conductive device may be manufactured by forming a single conductive element, adhering an insulating film to at least one surface of the conductive element, cutting the conductive element to form at least two conductive strips, laminating at least two layers of conducting elements to from a single assembly and fixing the assembly with a resin.

8 Claims, 9 Drawing Sheets

MULTI-LAYERED CONDUCTING DEVICES AND METHODS FOR MANUFACTURING THE SAME

BACKGROUND OF THE INVENTION

1. Field of the Invention

The present invention relates to multi-layered conducting devices having a plurality of conductive elements in multi-layers and methods for manufacturing the same.

2. Description of Related Art

In order to form an electric circuit having a plurality of conductive elements in two layers, a two-layered conducting devices having a plurality of conductive strips in two layers has been utilized to connect electric circuit components, such as capacitors. For example, in the two-layered conducting device shown in FIG. 10, three first conductive strips 120A are disposed in a first layer, three second conductive strips 120B are disposed in a second layer, and they are fixed with resin 150, wherein the respective conductive strips 120A and 120B are insulated from each other. Both the ends of the respective conductive strips 120A and 120B are folded to make connection ends 122A and 122B.

A device as described above has been manufactured by a method (device) shown in FIGS. 11(A) and 11(B).

The device has an upper mold 180 and a lower mold 182. Six supporting pins 181A and six supporting pins 181B are fixed in the upper mold 180. Two supporting pins 181A are used for each of the first conductive strips 120A. Two supporting pins 181B are used for each of the second conductive strips 120B. Since each of the first conductive strips 120A is disposed in the first layer (upper layer) while each of the second conductive strips 120B is disposed in the second layer (lower layer), each supporting pin 181A is short while each supporting pin 181B is long. Similarly, six supporting pins 183A (corresponding to each of the first conductive strips 120A) and six supporting pins 183B (corresponding to each of the second conductive strips 120B) are provided in the lower mold 182.

The upper mold 180 is combined with the lower mold 182 as shown in FIG. 11(B). Each of the first conductive strips 120A is positioned between the upper and lower molds 180 and 182 by each supporting pin 181A of the upper mold 180 and each supporting pin 183A of the lower mold 182. Furthermore, as shown in FIG. 11(A), each of the second conductive strips 120B is positioned between the upper and lower molds 180 and 182 by each supporting pin 181B of the upper mold 180 and each supporting pin 183B of the lower mold 182. In this arrangement, resin 150 is poured between the upper mold 180 and the lower mold 182, so that a two-layered conducting device as shown in FIG. 10 is produced. The device is formed on the upper surface thereof with holes 185 corresponding to the supporting pins 181A and 181B. Similarly, the device is formed on the lower surface thereof with holes (not shown) corresponding to the supporting pins 183A and 183B.

However, with the above-mentioned conventional device and manufacturing method, in order to provide insulation between each of the first conductive strips 120A and each of the second conductive strips 120B, a desired clearance C is required between the conductive strips 120A and 120B. Therefore, the device must be made thick to ensure proper separation. This is not favorable in view of saving space.

In addition, it is a cumbersome feature of the device described above that the supporting pins 181A and 181B are fixed on the upper mold 180 and the supporting pins 183A and 183B are fixed on the lower mold 182.

Furthermore, in a case where, as described above, supporting pins 181A and 181B are provided in the upper mold 180 and supporting pins 183A and 183B are provided in the lower mold 182, it is impossible to dispose conductive elements in more than two layers.

Finally, even though both the conductive strips 120A and 120B are disposed and fixed with resin 150 with clearance C provided between both the conductive strips 120A and 120B, the conductive strips 120A and 120B may be deformed by molding pressure when molding the same. Thus, if the conductive strips 120A and 120B are brought into contact with each other, then the insulation is broken.

SUMMARY OF THE INVENTION

It is, accordingly, an object of the invention to easily produce a thin device in which conductive elements are disposed in multiple layers.

In order to achieve the above object, the present invention provides a multi-layered conducting structure which comprises a plurality of conductive elements disposed in multiple layers, and one or more insulating films disposed between the respective layers of conductive elements.

"A plurality of conductive elements in multiple layers" means that there are a plurality of layers having conductive elements. Each layer may have a plurality of individual conductive elements or each layer may have only a single conductive element.

In some cases, two or more insulating films may be disposed between conductive elements of each layer and therefore, the invention is not limited to devices having only one insulating films between layers of conductive elements.

With this structure, since the conductive elements of each layer are seprated by an insulating film(s), the distance between the conductive elements of each layer is made almost equal to the thickness of the insulating film(s). Therefore, it is possible to dispose conductive elements of each layer in proximity to each other in an insulated state, and it is possible to make the entire structure thin.

In addition, the insulating film may be attached to the conductive elements adjacent thereto.

"Adjacent thereto" means that the above-mentioned insulating films are adjacent to the above-mentioned conductive elements in their disposing (laminating) direction. "The insulation film may be adhered to the conductive element adjacent thereto" means a case in which an insulating film(s) may be adhered in the same direction (upper surface or lower surface) of the conductive elements of each layer or where the respective insulating films may be adhered to both surfaces of the conductive elements of each layer. Furthermore, the present device can be constructed without adhering an insulating film to a conductive segment or strip before assembly. For example, in a case in which conductive elements are laminated in three layers, the insulating film could be adhered to both surfaces of the second layer of conductive elements and no insulating film is adhered to either surface of the first and third layers of conductive elements.

With this structure, since an insulating film is attached to its adjacent conductive element, it becomes possible to integrally laminate the adhered insulating film and conductive elements, and the efficiency of assembling such devices can be improved.

In one preferred embodiment, the insulating film may be attached to at least one surface of each respective conductive elements. With this structure, since insulating film is attached to all of the conducting elements, there is no layer in which conductive elements alone are disposed, and the efficiency of assembling such a device can be improved. Furthermore, in a layer which has a plurality of conductive elements, since the relative position of each conductive element in the layer is fixed by the insulating film, the efficiency for disposing the respective conductive elements in one layer can be improved.

The present invention further provides a multi-layered conducting device which comprises a structure having multiple layers of conductive elements and one or more insulating films disposed between the respective conductive elements.

The insulating film may be attached to the conductive element adjacent thereto.

The insulating film may be attached to at least one surface of the respective conductive elements.

"May be attached" means that the respective layers may be adhered to each other by an adhesive or that their disposed state may be fixed with resin or other materials.

The device includes the multi-layered conductive structure in which the conductive elements of each layer can be disposed in proximity to each other in an insulated state. Therefore, it is possible to make the device thin.

The present invention further provide a method for manufacturing a multi-layered conducting structures having a plurality of conductive elements disposed in at least two layers, which comprises the steps of covering at least one surface of each conductive element with an insulating film to form a layer of an insulating film-covered conductive elements(s), and laminating the respective layers of insulating film-covered conductive elements.

In the method, each of the respective insulation films may be provided with a common guide hole.

With this method, it is possible to easily laminate a plurality of insulating film-covered conductive elements at an appointed position by laminating the plurality of insulating film-covered conductive elements on the basis of guide holes formed in common on the insulation films of each layer.

The present invention further provides a method for manufacturing a multi-layered conductive device having a plurality of conductive elements disposed in multiple layers, which comprises the steps of covering at least one surface of each conductive element with an insulating film to form an insulating film-covered conductive element for each of the respective layers, laminating the plurality of insulating film-covered conductive elements, and fixing the plurality of insulating film-covered conductive elements in a laminated state.

With these methods, it is possible to easily produce a multi-layered conductive structure.

In these method, each of the respective insulating films may be provided with a common guide hole.

With these method, it is possible to easily produce a multi-layered conducting device in which the insulating film-covered conductive elements are laminated at an appointed position at every layer.

DETAILED DESCRIPTION OF THE PREFERRED EMBODIMENT

A preferred embodiment of the invention will now be described with reference to the accompanying drawings.

Figure 1:
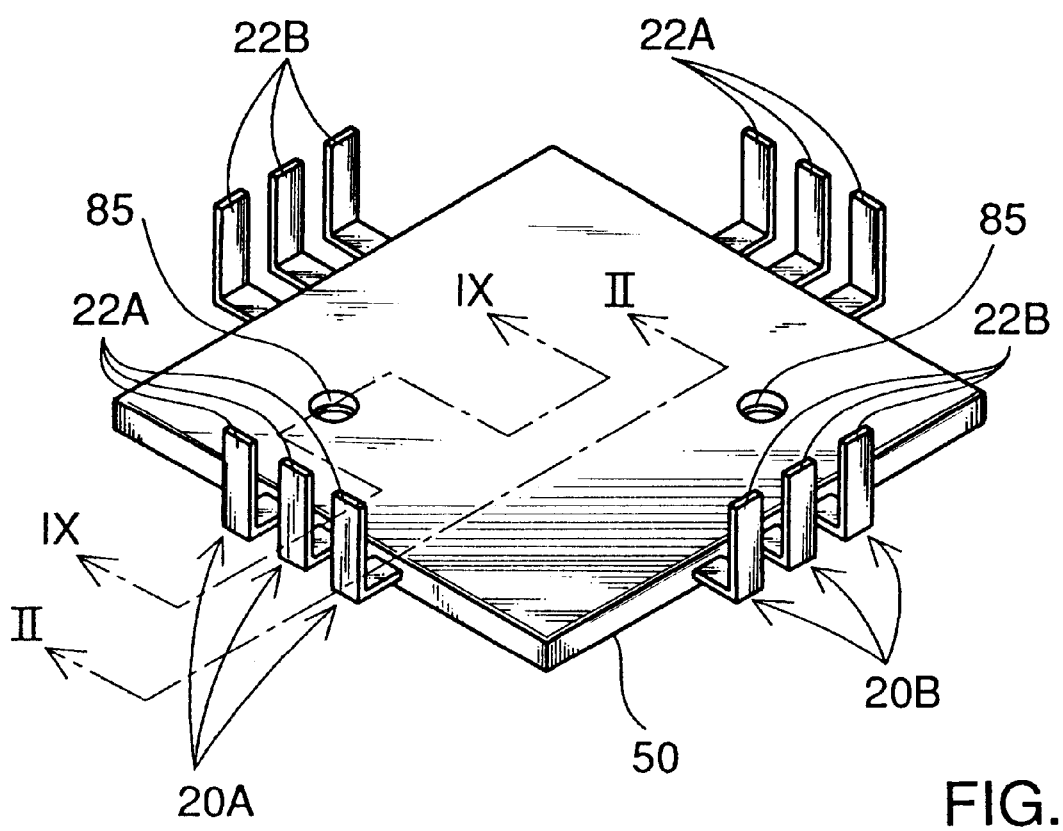
FIG. 1 is a perspective view showing a conducting device according to a preferred embodiment of the invention.
Figure 2:
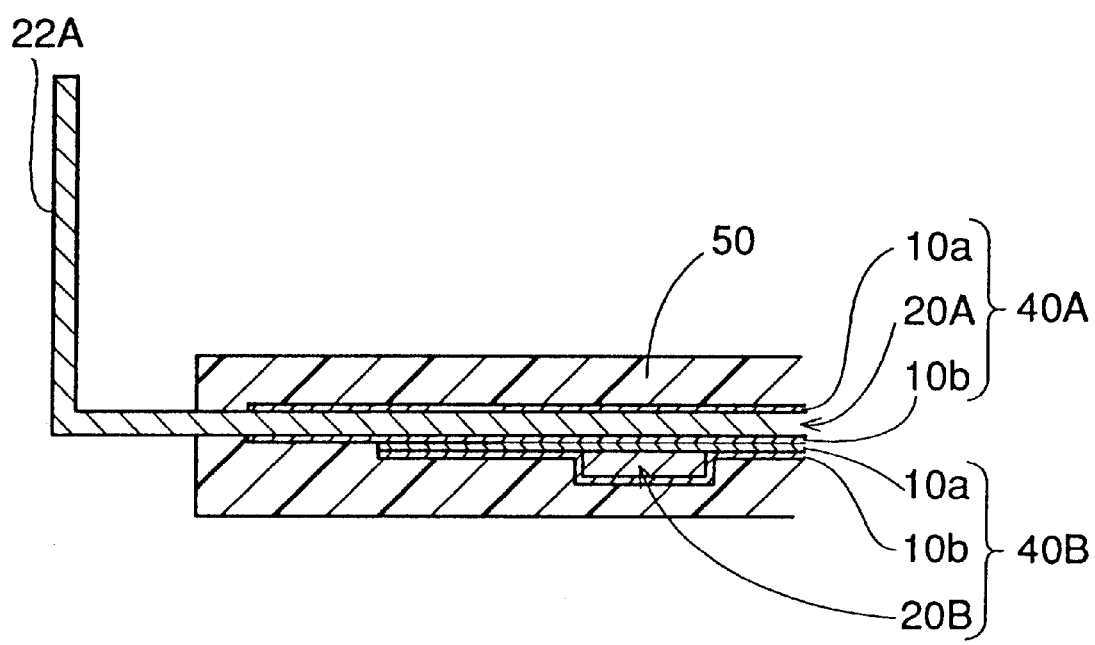
FIG. 2 is a cross-sectional view of the device shown in FIG. 1, with a part thereof enlarged, taken along the line II—II.

Referring to FIGS. 1 and 2, shown therein is a multi-layered conductive structure (multi-layered conductive device).

The device (structure) has conductive strips disposed in two layers, wherein three first conductive strips 20A are disposed in a first layer (an upper layer) while three second conductive strips 20B are disposed in a second layer (a lower layer). The first conductive strips 20A of the first layer and the second conductive strips 20B of the second layer are disposed so as to become orthogonal to each other. These conductive strips 20A and 20B are fixed with resin 50. Both ends of the respective conductive strips 20A and 20B are folded to make connection ends 22A and 22B to which electric circuit elements such as capacitors, transistors and other devices can be connected.

Insulating films 10a and 10b are adhered to (applied to cover) both of the upper and lower surfaces of the first conductive strips 20A of the first layer. As described later, the first conductive strips 20A are integrally covered by both films 10a and 10b.

Similarly, insulating films 10a and 10b are adhered to (applied to cover) both of the upper and lower surfaces of the second conductive strips 20B of the second layer.

The first layer (its lower film 10b) and the second layer (its upper film 11a) overlap with each other.

As described above, in the device (structure), the first conductive strips 20A are insulated from the second conductive strips 20B by films 10b and 10a disposed therebetween. Therefore, the distance between both the first conductive strips 20A and the second conductive strips 20B is substantially the same as the thickness of both the films 10b and 10a, which can be very thin, so that the entirety of the device (structure) can be manufactured to be thin.

Furthermore, it is not necessary that the entirety of the conducting elements be fixed with resin. Both the films 10b and 10a may be adhered to each other or the respective members may be only laminated.

Furthermore, only a single film may be provided between the first and second conductive strips 20A and 20B.

Furthermore, it is also possible that the film 11a is not disposed on the upper surface of the first conductive elements 20A and that the film 10b is not disposed on the lower surface of the second conductive elements 20B.

Furthermore, conductive elements may be disposed in three or more layers without being limited to two layers, and the device (structure) may be constructed such that at least one insulating film is secured between the respective conductive elements.

Furthermore, it is not necessary to dispose a plurality of conductive elements in every layer, and there may be a layer in which a single conductive elements is disposed.

A process for manufacturing the above-mentioned multi-layered conductive device (FIGS. 1 and 2) will now be described with reference to FIGS. 3 to 9.

Figure 3:
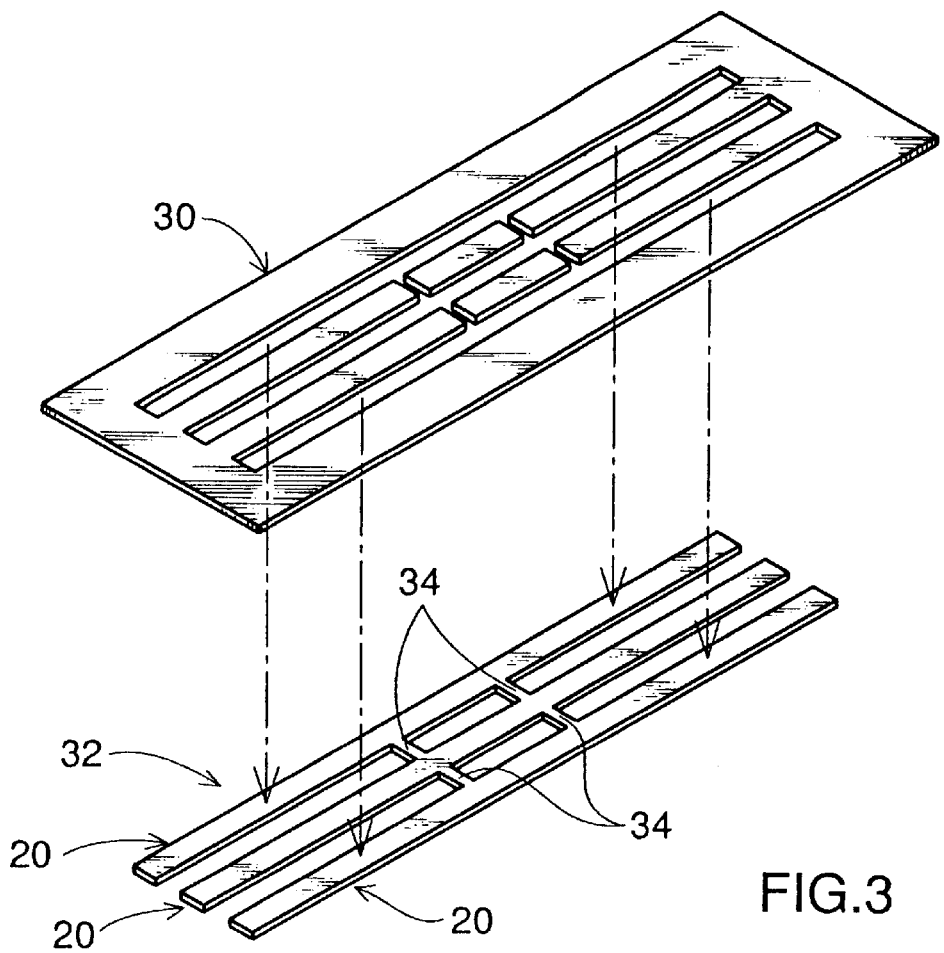
FIG. 3 is a view showing a process by which a connected conductive segment is formed from a metallic plate.
Figure 4:
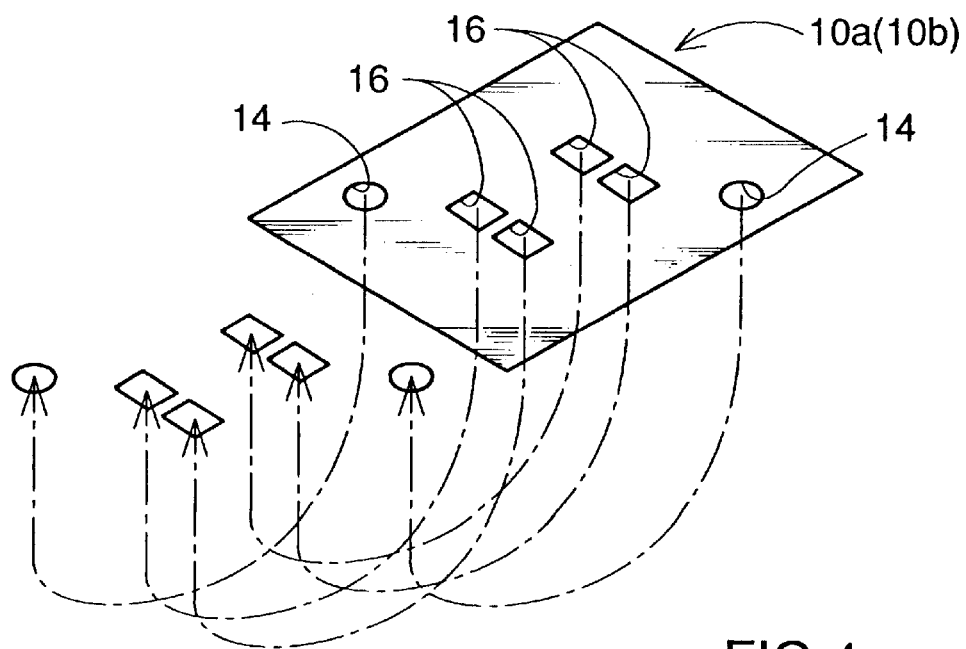
FIG. 4 is a view showing a process by which guide holes and punching holes are formed in a film.
Figure 5:
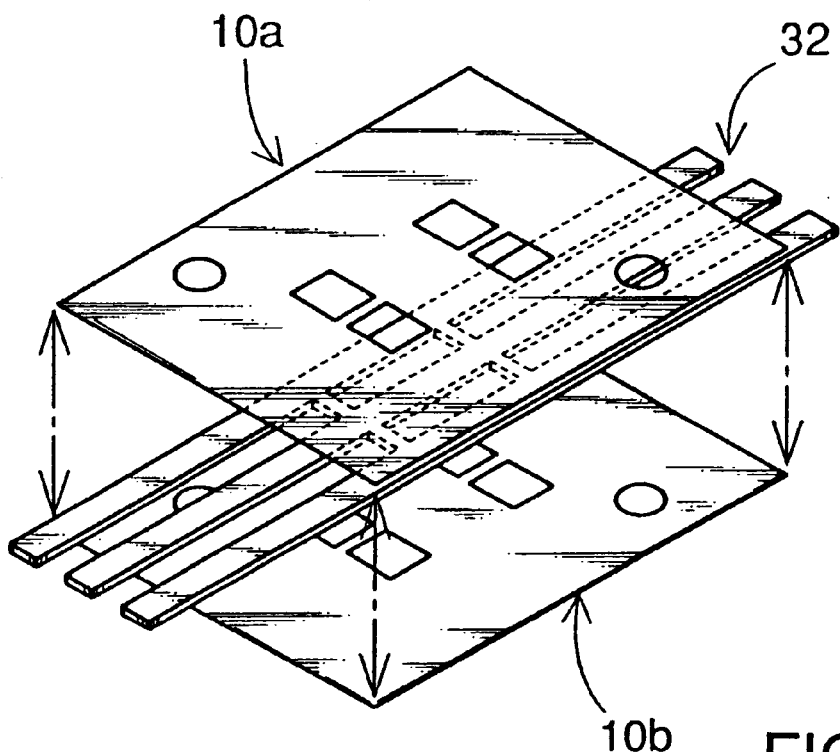
FIGS. 5(A) and 5(B) are views showing a process by which the connected conductive segment is covered by two films.
Figure 5:
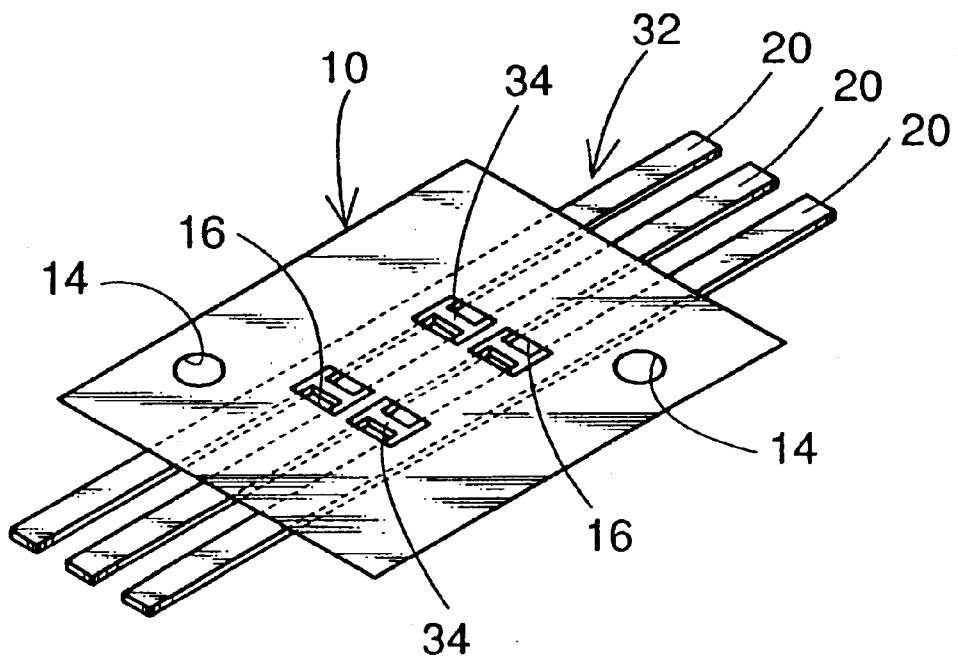

First, a single metallic plate 30 (See FIG. 3) and two insulation films 10a and 10b are prepared (See FIG. 4). Both the films 10a and 10b preferably are of the same structure. FIG. 4 shows only one film for convenience. Each film is made of a material having an insulating property, such as PET, PBT, PPS and other materials, the thickness of which preferably is 0.05 to 0.15 mm.

As shown in FIG. 3, a connected conductive element 32 may be produced by die-cutting the metallic plate 30. The connected conductive element 32 is constructed in such a manner that three conductive strips 20 are coupled to each other by connecting portions 34. The respective conductive strips 20 are made parallel to each other and are proximate to each other. The two sets of connecting portions 34 may be provided between adjacent conductive strips 20.

With respect to FIG. 4, the respective films 10a and 10b may be die-cut to produce guide holes 14 and punching holes 16.

Two guide holes 14 are diagonally formed, and the punching holes 16 are formed at the positions corresponding to the respective connecting portions 34 of the connected conductive element 32.

Next, as shown in FIGS. 5(A) and 5(B), the films 10a and 10b may be respectively thermally adhered to both the surfaces of the connected conductive element 32. Hereinafter, the films 10a and 10b thus joined are merely referred to as film 10.

Figure 6:
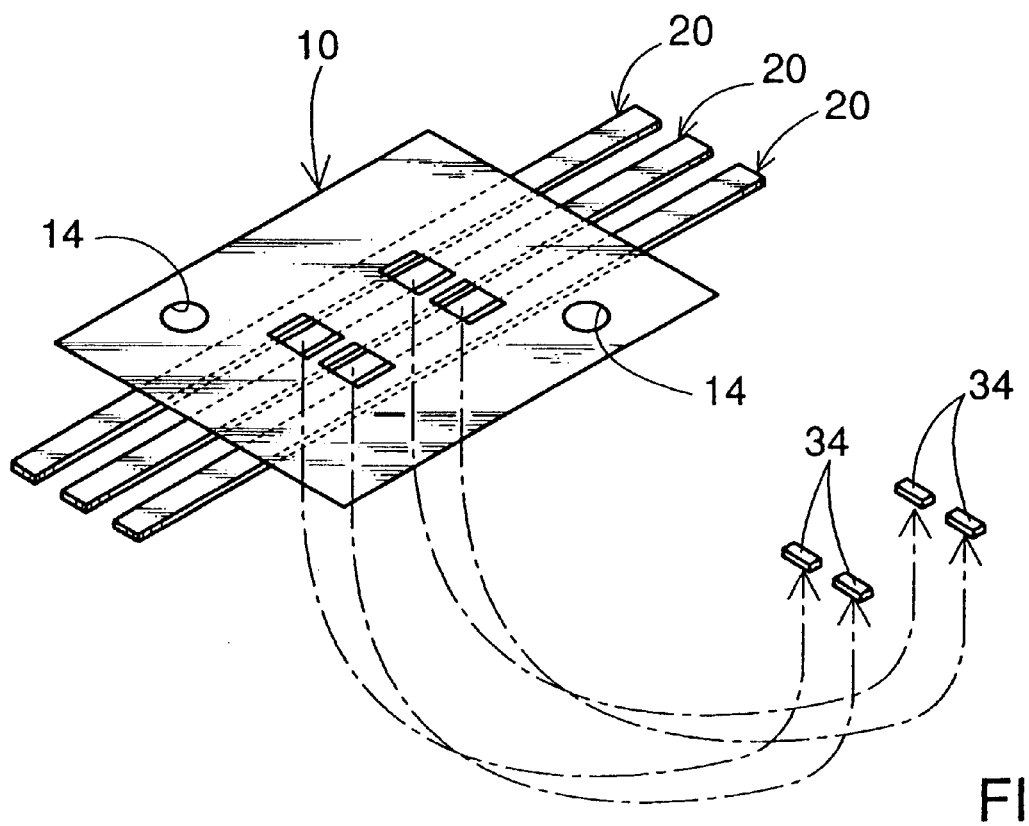
FIG. 6 is a view showing a process by which connected portions are eliminated from the conductive segment shown in FIG. 5(B)

Subsequently, as shown in FIG. 6, in the assembly obtained as shown in FIGS. 5(A) and 5(B), the connecting portions 34 are removed, preferably by punching the connecting portions 34 using a punching machine.

Thus, the three independent conductive strips or elements 20 are produced from the connected conductive element 32.

Figure 7:
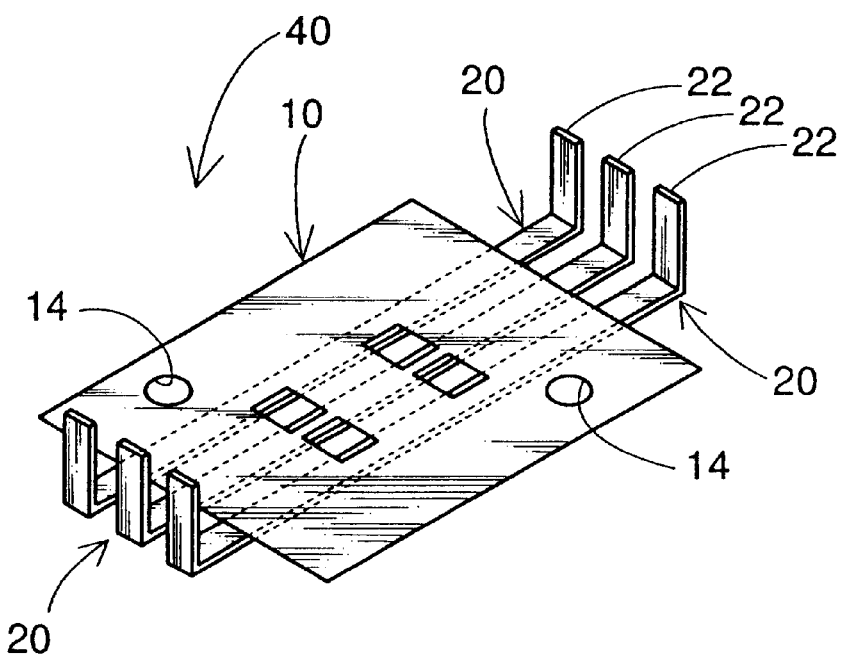
FIG. 7 is a view showing a process by which the ends of the conductive strips are folded from the piece shown in FIG. 6.
Figure 8:
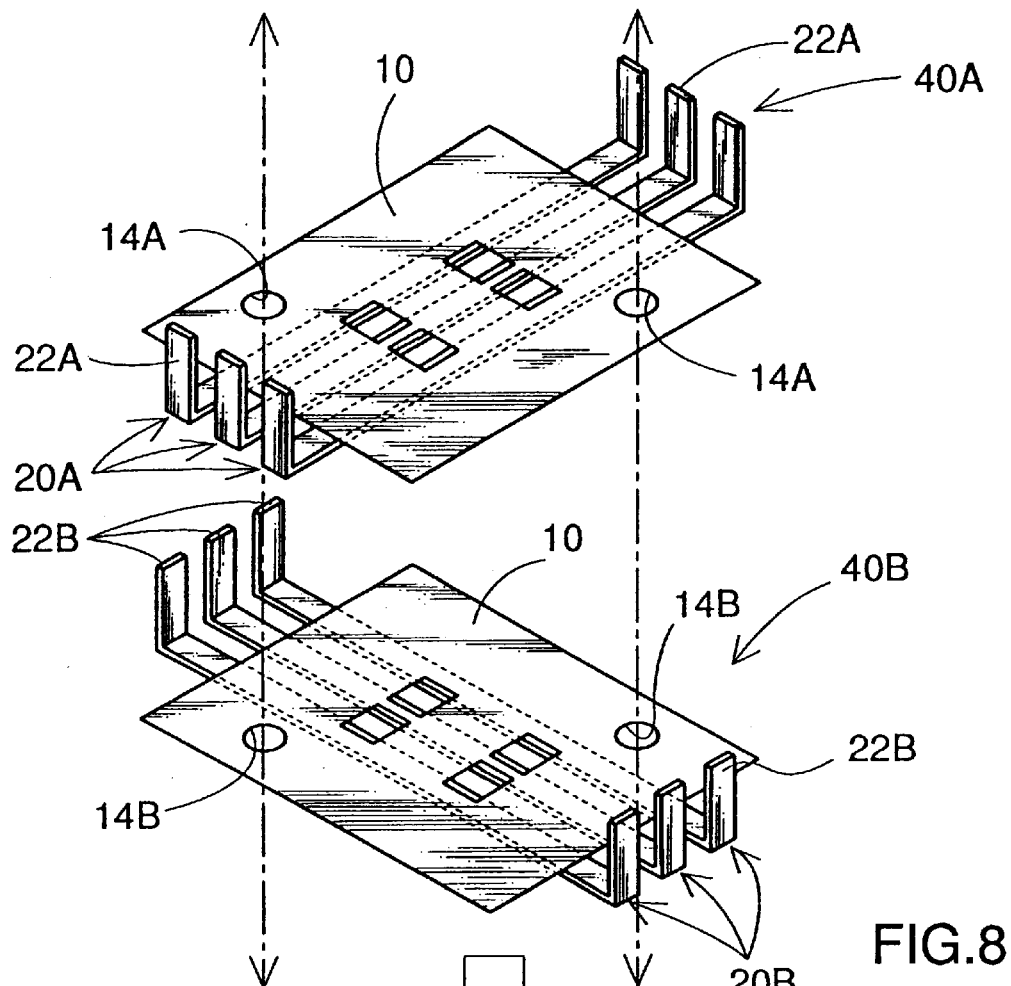
FIGS. 8(A) and 8(B) are views showing a process by which two set of film-adhered conductive strips are laminated.
Figure 8:
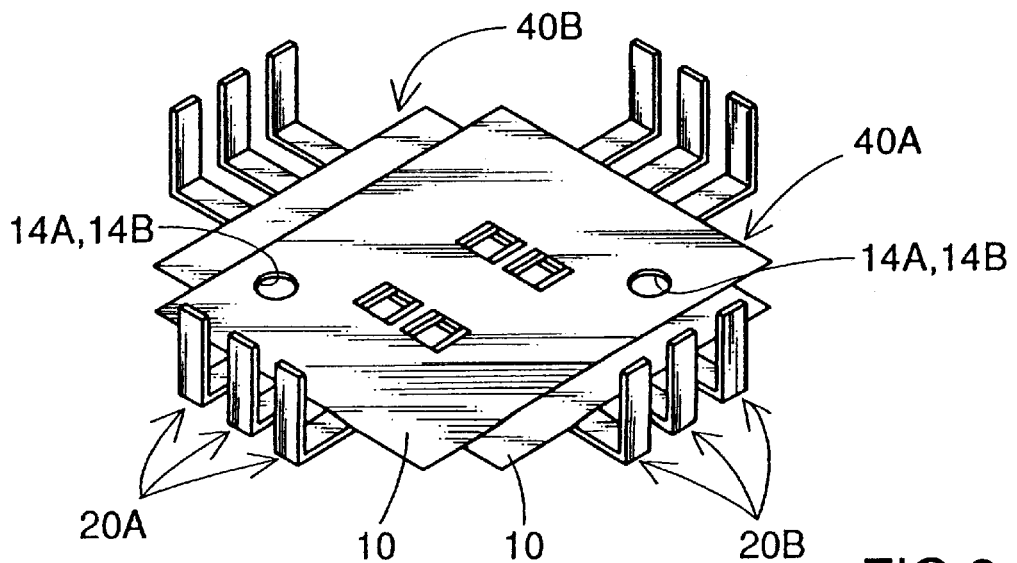

As shown in FIG. 7, both ends of the each conductive strip 20 may be upwardly folded at right angles to form connecting terminals 22.

As described above, a plurality (for example, two) of film-adhered conductive elements 40 (40A and 40B) are formed (See FIGS. 7 and 8(A)). These correspond to insulation film-covered conductive elements.

Hereinafter, it is assumed that the conductive elements 20, the connecting terminals 22 and the guide holes 14 of the film-adhered conductive layer 40A are represented as elements 20A, 22A and 14A, respectively, and that the conductive elements 20, the connecting terminals 22 and the guide holes 14 of the film-adhered conductive layer 40B are represented as 20B, 22B and 14B, respectively (See FIG. 8(A)).

Next, as shown in FIGS. 8(A) and 8(B), the two film-adhered conductive layers 40A and 40B may be laminated to form a single assembly. At this time, both layers are laminated at an appointed position on the basis of guide holes 14 (14A and 14B). A perpendicular pin (not shown) may be inserted into the respective guide holes 14A and 14B. The respective guide holes 14A and 14B of the film-adhered conductive layers 40A and 40B are formed in advance at positions diagonally corresponding to each other.

Figure 9:
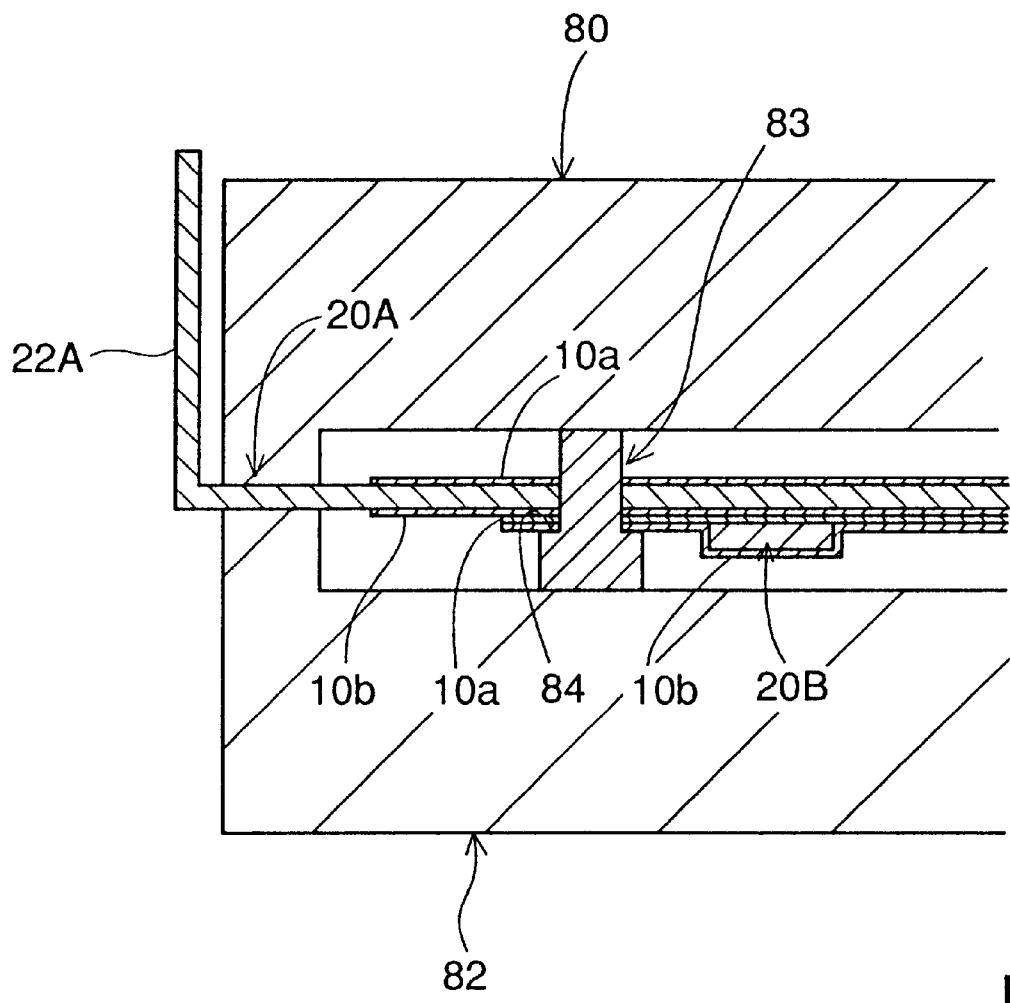
FIG. 9 is a view showing a process by which the assembly shown in FIG. 8(B) is fixed with resin 50, wherein the end face cross-cut along the line IX—IX in FIG. 1 is illustrated in enlargement.
Figure 10:
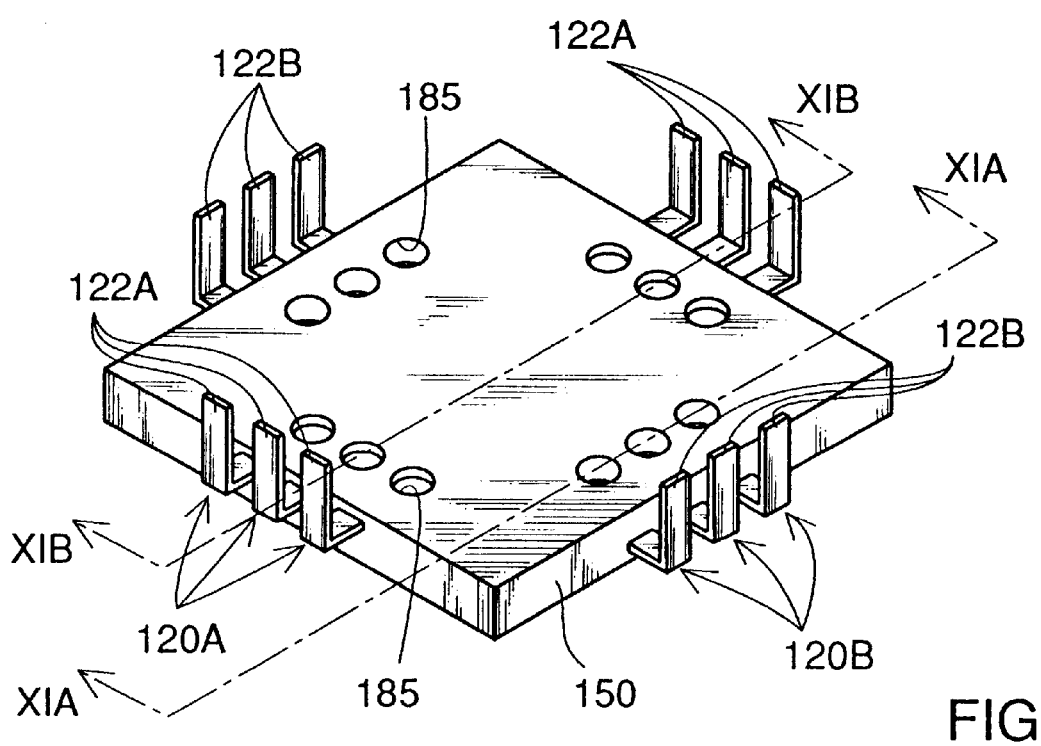
FIG. 10 is a perspective view showing a two-layered conducting device produced by a conventional manufacturing method.
Figure 11:
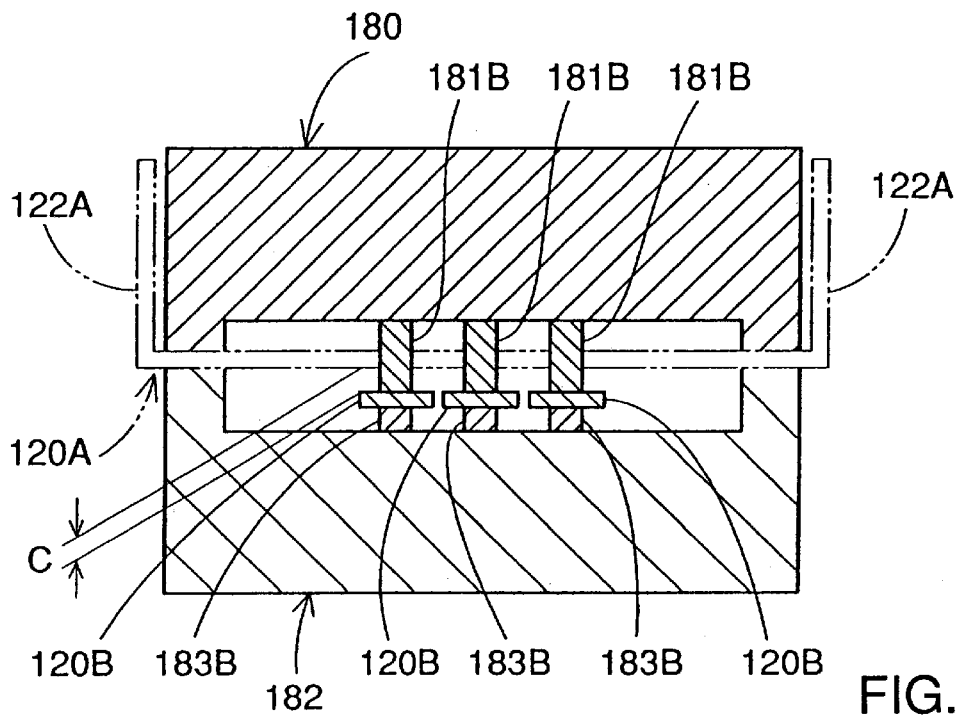
FIGS. 11(A) and 11(B) are end face views showing a conventional manufacturing method (device) showing the end face cross-cut along the lines XIA—XIA and XIB—XIB in FIG. 10, respectively.
Figure 11:
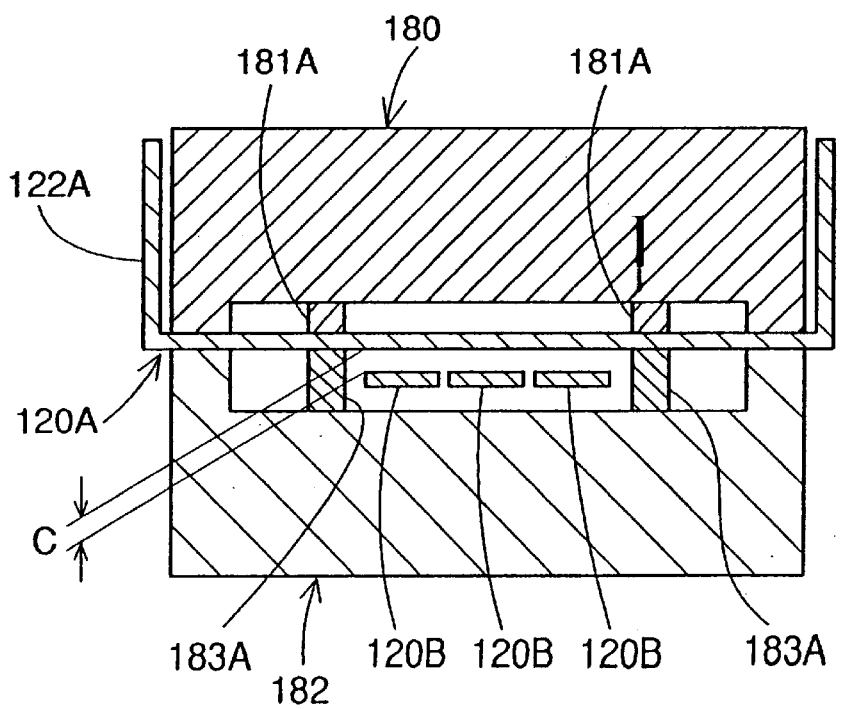

Next, as shown in FIG. 9, the assembly shown in FIG. 8(B) can be fixed with resin 50. For example, the assembly shown in FIG. 8(B) is placed between an upper mold 80 and a lower mold 82. A guide pin 83 is fixed at the lower mold 82. The guide pin 83 is substantially columnar, the lower part of which has a slightly larger diameter, having an annular shoulder face 84.

The guide pin 83 is inserted into the guide holes 14A and 14B of the assembly shown in FIG. 8(B), and the assembly is received by the annular shoulder 84, so that the assembly shown in FIG. 8(B) is installed at an appointed position and at an appointed height. In this arrangement, resin 50 may be poured into the space between the upper mold 80 and the lower mold 82.

By the above-mentioned procedures, it is possible to produce the multi-layered conductive device shown in FIGS. 1 and 2. Furthermore, each of the hole portions 85 corresponds to each of the guide pins 83.

Subsequently, it is possible to easily form electric circuits by connecting electric circuit elements, such as capacitors, transistors and other devices, to the end portion 22 of the respective conductive strips 20 of the device.

This manufacturing method has the following advantages.

Both the surfaces of the conductive strips 20 of the respective layers are adhered with insulating films 10a and 10b, thereby forming a film-adhered conductive element 40 (40A and 40B). The film-adhered conductive elements 40A and 40B thus formed are laminated to form the multi-layered conductive device. Therefore, it is possible to dispose the conductive strips 20 of the respective layers in a proximate state without producing insulation failure, resulting in easy production of thin devices (structures).

Furthermore, guide holes 14A and 14B are formed in advance at each of the film-adhered conductive elements 40A and 40B, and the film-adhered conductive elements 40A and 40B are laminated in accordance with the guide holes 14A and 14B. Therefore, it is possible to easily laminate both of the film-adhered conductive elements 40A and 40B in an appointed positional relationship.

Furthermore, in the respective layers, since a plurality of conductive elements 20 are covered by the films 10a and 10b, by covering a single connected conductive segment 32 without directly coating the individual conductive strips by the films 10a and 10b, it is possible to easily dispose a plurality of conductive strips 20 in each layer at an appointed positional relationship.

While the invention has been described with reference to a specific embodiment, the description is illustrative and is not to be construed as limiting the scope of the invention. Various modifications and changes may occur to those skilled in the art without departing from the spirit and scope of the invention as defined by the appended claims.

What is claimed is:

1. A multi-layered conductive structure comprising a plurality of conductive elements, each having a first surface and a second surface, disposed in at least two adjacent layers, the first layer comprising at least one of said conductive elements covered with a first insulating film over said first surface and covered with a second insulating film over said second surface, and the second layer comprising at least one of said conductive elements covered with a first insulating film over said first surface and covered with a second insulating film over said second surface, whereby two adjacent layers are separated by two N insulating films.

2. The structure of claim 1, wherein said plurality of films are attached to the respective surfaces of the conductive elements.

3. A multi-layered conductive device comprising a plurality of individual conductive strips, each of said conductive strips having a first surface and second surface, disposed in multiple layers, the first surface of each of said conductive strips being covered with an insulating film and the second surface of each of the conductive strips being covered with an insulating film, whereby two insulating films separate adjacent layers of conductive strips.

4. The device of claim 3, wherein said insulating films are attached to respective surfaces of the conductive strips.

5. A method for manufacturing a multi-layered conductive structure having a plurality of conductive elements disposed in at least two layers, comprising the steps of:

forming a first layer including at least one conductive element and covering first and second surfaces of the at least one conductive element with first and second insulating films;

forming a second layer including at least one conductive element and covering first and second surfaces of the at least one conductive element with first and second insulating films; and laminating together the first and second layers of conductive elements covered with insulating films to form a multi-layered conductive structure in which adjacent layers are separated by two insulating films.

6. The method of claim 5, wherein each of said insulating films is provided with a common guide hole.

7. A method for manufacturing a multi-layered conductive structure having a plurality of conductive elements disposed in multiple layers, comprising the steps of:

forming a plurality of layers of conductive elements, each said layer being formed by covering first and second surfaces of conductive elements of said layer with first and second insulating films, respectively;

laminating together said layers of conductive elements covered with insulating films to form a multi-layered conductive structure in which adjacent layers are separated by two insulating films; and fixing said plurality of layers in a laminated state.

8. The method of claim 7, wherein each of said insulating films is provided with a common guide hole.

* * * * *